US005775806A

United States Patent [19]
Allred

[11] Patent Number: 5,775,806
[45] Date of Patent: Jul. 7, 1998

[54] INFRARED ASSESSMENT SYSTEM

[75] Inventor: Lloyd G. Allred, Bountiful, Utah

[73] Assignee: The United States of America as represented by the Secretary of the Air Force, Washington, D.C.

[21] Appl. No.: 712,920

[22] Filed: Sep. 12, 1996

[51] Int. Cl.$^6$ ...................................................... G01J 5/00
[52] U.S. Cl. .............................. 374/124; 374/5; 250/342
[58] Field of Search ............................... 374/4, 5, 43, 57, 374/120, 121, 124, 129, 137; 250/330, 341.8, 342, 358.1; 356/237; 348/129; 364/507, 552, 557

[56] References Cited

U.S. PATENT DOCUMENTS

| | | | |
|---|---|---|---|
| 3,868,508 | 2/1975 | Llyod | 250/330 |
| 4,647,220 | 3/1987 | Adams et al. | 374/124 |
| 4,733,175 | 3/1988 | Levinson | 374/124 |
| 4,899,052 | 2/1990 | Lindquist | 250/342 |
| 5,021,981 | 6/1991 | Swartzel et al. | 364/557 |
| 5,032,727 | 7/1991 | Cox, Jr. et al. | 374/4 |
| 5,052,816 | 10/1991 | Nakamura et al. | 374/5 |
| 5,159,564 | 10/1992 | Swartzel et al. | 364/557 |
| 5,165,794 | 11/1992 | Ortiz | 374/43 |
| 5,197,470 | 3/1993 | Helfer et al. | 128/634 |
| 5,228,776 | 7/1993 | Smith et al. | 374/5 |
| 5,250,809 | 10/1993 | Nakata et al. | 374/124 |
| 5,292,195 | 3/1994 | Crisman, Jr. | 374/4 |
| 5,298,970 | 3/1994 | Takamatsu et al. | 356/349 |
| 5,582,495 | 12/1996 | Lesniak | 374/5 |

*Primary Examiner*—G. Bradley Bennett
*Attorney, Agent, or Firm*—William G. Auton

[57] ABSTRACT

A process and system for determining the integrity of an object by analyzing its dynamic heat properties is disclosed. A properly functioning reference object is heated and an infrared camera is positioned above the object. A digital computer collects the infrared images of the object and analyzes its dynamic heat properties. Only heat changes within predefined regions of the object are analyzed and the data is reduced to a peak temperature across each region for a given time. This data is stored and used for future reference. Next, a test object is sampled in the same manner. The reference and test object data is then compared by employing a complex neural network. The neural network uses confidence estimates and historical data on similar reference and test objects to determine the integrity of the object. Thermal images of objects under test are graphically displayed on a video screen. Out-of-profile regions are indicated on the thermal image by displaying the region's actual heating rate and a range of acceptable heating rates.

18 Claims, 1 Drawing Sheet

INFRARED ASSESSMENT SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates to a process and system to evaluate the functional status of an object by analyzing its dynamic heat properties using a series of infrared images. While infrared imaging systems have been used for diagnostic purposes, they have drawbacks that have been eliminated by the subject invention. Traditional systems utilize an infrared camera to extract thermal characteristics of viewed objects and diagnose faulty components through an image by image comparison in which one image is "differenced" from the other. This method has proven effective under conditions of high thermal contrast but requires exact alignment of the images. Exact alignment is time-consuming and difficult to achieve. Minor misalignments can cause large differences in images. These large differences obscure the real differences in temperature. Also, traditional systems do not effectively utilize data from prior test results to make subsequent tests faster and more reliable. In addition, many traditional systems utilize rather primitive graphic schemes to represent thermal images and temperature differences. When higher resolution images are used, only a single image, or a few images, are used for each object under test.

Thus, there exists a need to make the testing process more reliable under conditions of both high and low thermal contrasts. Also, there is a need to better utilize the data from prior tests to more accurately and quickly predict where flaws may exist in subsequent objects under test. Finally, the ability to analyze a large number of high-resolution graphic images of objects under test would greatly enhance the accuracy of visual assessments made by the operator of the test system and increase the overall accuracy of the system as a whole. The subject invention addresses all of these needs of the following prior art patents, which are incorporated herein by reference.

U.S. Pat. No. 3,868,508 issued to Lloyd;
U.S. Pat. No. 4,899,052 issued to Lindquist;
U.S. Pat. No. 5,021,981 issued to Swartzel et al;
U.S. Pat. No. 5,159,564 issued to Swartzel et al;
U.S. Pat. No. 5,165,794 issued to Ortiz;
U.S. Pat. No. 5,197,470 issued to Helfer et al;
U.S. Pat. No. 5,228,776 issued to Smith et al; and
U.S. Pat. No. 5,298,970 issued to Takamatsu et al.

The Lloyd patent detects infrared radiation generated by an electric circuit by applying electrical power to the reference and test circuits, scanning the circuits with an infrared camera, and determining the differences between the thermal characteristics of the two images. All parts of the reference and test circuits within the view of the camera are analyzed and compared. Each point scanned on the reference and test circuits is assigned a five-level code, which reflects the amount of infrared radiation emanating from the circuit at that point. The codes of the test circuit are subtracted from the codes of the reference circuit. This difference is then graphically displayed on a video screen or printer. This patent uses a rather primitive graphic scheme of simple characters found on a standard computer keyboard to display the images.

The Lindquist patent is a diagnostic instrument for detecting infrared radiation in the repair of electronic equipment containing an infrared radiation emitter.

The Swartzel et al patents teach a method for determining the thermal history of an object by detecting the change in calibration materials after a thermal treatment, and recording the thermal history using metal insulator semiconductor capacitors.

The Ortiz patent teaches a method for determining thermophysical properties of a conducting system by measuring electrical resistances between at least two pairs of external leads.

The Helfer et al patent discloses an instument and method for using near infrared to differentiate healthy tissue from diseased tissue using a catheter and a spectrophotometer.

The Smith et al patent uses an intensity modulated pump laser beam to evaluate the integrity of vias, and evaluate the thermal and electrical characteristics in a sample.

The Takamatsu et al patent teaches a method for evaluating samples by measuring the thermal expansion displacement on the surface of a sample when the sample is irradiated using a cyclically intensity-modulated excitation beam.

SUMMARY OF THE INVENTION

This invention consists of a process and apparatus for measuring and comparing heating rates of reference and test objects to determine the functional status of an object. An infrared camera is used to scan a reference object under test and measure the infrared radiation emitted therefrom. Only thermal characteristics measured within regions defined by the operator are used for analysis. A digital computer is used to store the reference data and determine the heating rates for designated regions on the reference object. The infrared radiation emitted from a test object is similarly scanned and measured by an infrared camera. The test data is also stored in a digital computer and the heating rates for the test object are similarly calculated. The reference and test object heating rates are then compared. Regions on the test object are flagged if their heating rates exceed specified tolerances. A high-resolution image of the object under test is displayed on a video screen which graphically represents the intensity of the infrared radiation emitted from the object under test. Different regions can be graphically displayed without displaying the entire image of the object.

One object of the present invention is to provide more reliable testing of objects by incorporating a method of measuring temperatures whereby each pixel of the infrared image is examined and compared with neighboring pixels. A pixel is not used in the analysis if it does not have an equally high temperature as a neighboring pixel. This eliminates the risk that a minor misalignment will corrupt the entire temperature analysis.

Another object of the present invention is to provide a way to effectively utilize historical test data by using a modified neural network to process the data. The unique processing scheme of this invention stores data compiled from numerous test sequences, breaks down objects under test into different categories, and develops confidence estimates based upon the historical data and the object's category classification. This enables the operator to determine, even before performing a test, which region of the object is likely to be faulty.

In addition, the present invention utilizes high-resolution graphic images to display the thermal characteristics of objects under test. The ability to take a closer look at an area of the thermal image by "zooming" into that area, to view the thermal images of the reference and test objects side by side on the video screen at the same time, and to see the out-of-tolerance regions clearly flagged on the video screen enables the operator to make more accurate visual assessments of objects under test.

These and many other objects and advantages of the present invention will be readily apparent to one skilled in the pertinent art from the following detailed description of a preferred embodiment of the invention and the related drawings.

DESCRIPTION OF THE PREFERRED EMBODIMENT

Figure 1:
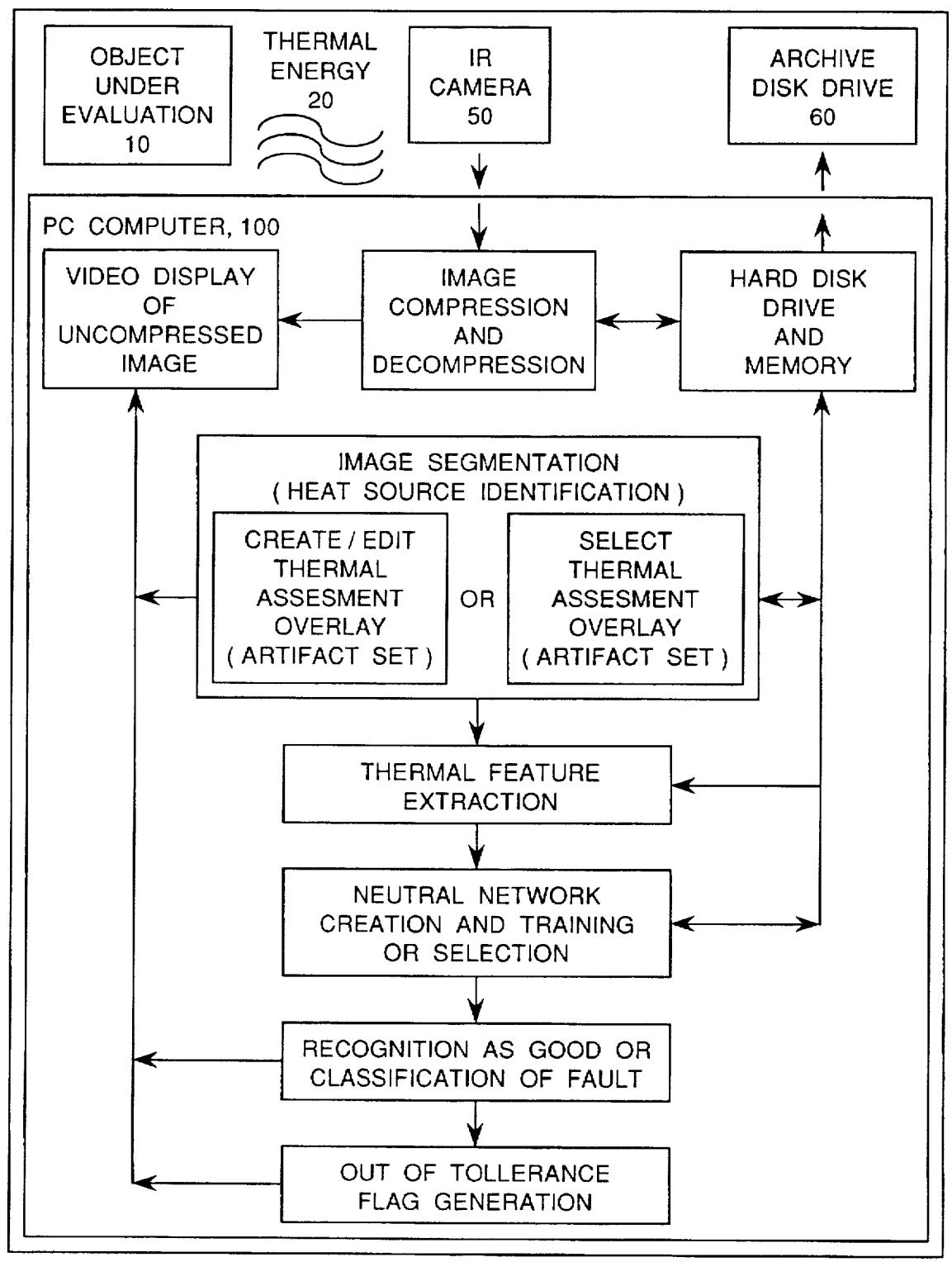
FIG. 1 is an overview of the entire process.

As shown in FIG. 1, this invention can be used to test any object 10 that has dynamic heat properties. In order to test an object, it must be subjected to heat. An object may be heated either externally, by flooding it with a heat source, or internally, which occurs when an electric circuit under test generates its own heat 20 due to an application of electricity to the circuit and the stimulation of components. Automatic test equipment may be used to stimulate electric circuits under test.

Before an object 10 is tested, the operator uses a digital computer 100 and software to define regions on the object to be analyzed. An image of the object under test is graphically displayed on a video screen with areas of interest delineated. These defined areas of interest are called artifacts. The operator creates artifacts by using software tools that are a part of the subject invention. Traditional "drag and drop" editing capabilities using a mouse are used to accomplish the drawing and copying of outlines for any viewable image. A two-letter designator is assigned to each artifact allowing 676 regions to be defined. Only heat events occurring within the defined artifacts will be measured and analyzed. This is a good tool for pinpointing specific problem areas of a test object or circuit.

Before a suspected "faulty" object is tested, a reference object is tested in order to develop baseline data to be compared to the test object data. A reference object only needs to be tested once for each type of object under test. Data can be compiled on one reference object, then data from many test objects can be analyzed and compared with the data from the reference object without having to re-test the reference object. Conversely, many reference objects may be tested to compile a large amount of reference data, then a "faulty" object can be tested against that data.

An infrared camera 50 is positioned over the object to be tested 10. Using the camera, the digital computer 100 begins to collect infrared images of the object and stores them in its memory and on magnetic disk. Best results have been obtained when collecting 25 images spaced at 12 seconds per image. Since graphic images utilize large amounts of magnetic disk storage space, the preferred embodiment of the subject invention would employ a lossless data compression/decompression technique to store and retrieve the graphic images. Any of the well-known lossless data compression/decompression schemes could be used.

After the digital computer 100 begins collecting infrared images of the object, heat causing energy is applied, either internally or externally, to the object. As the object heats up, images are continually collected by the infrared camera 50 and the digital computer 100. As images are collected, the change in heat (heating rate) of each defined artifact is determined. Image data associated with each artifact is reduced to a single peak temperature value. Each pixel of an infrared image represents a measure of temperature of the scanned object 10. A technique is used whereby a pixel within an artifact is compared with a neighboring pixel within the artifact. If a pixel does not have an equally high temperature as its neighbor, it is not accepted as a peak temperature value. This technique ensures an accurate peak temperature within an artifact because every pixel within the artifact is compared to its neighbor. Lower temperatures are rejected and do not corrupt the peak temperature analysis. This peak temperature extraction is performed for each defined artifact on each infrared image collected. The artifact peak temperatures for each image are stored, along with the corresponding time that each image was collected. Therefore, what remains is a single set of temperature profiles for each artifact.

Under ideal conditions of constant material properties, constant power application, and perfect heat sink, the temperature rise can be described by an equation:

$$\frac{dT}{dt} = C_v P - kT \qquad (1)$$

Where:

P is the applied power.

$C_v$ is the heat capacity.

T is temperature rise (T=0 when the test item is at ambient temperature).

t is time.

k is a constant specifying the dissipation of heat, either conducted to an external heat sink or radiated into space.

Under conditions of constant applied power and constant material properties, the above differential equation can be solved, yielding a solution for temperature rise:

$$T = \frac{C_v P}{k} (1 - e^{-kt}) \qquad (2)$$

Unfortunately, the practical application is somewhat less than ideal, and the above equation provides a very poor fit to real data. The reasons for this disparity are manifold. The heat sink is not perfect, material properties change as the temperature rises, and heat is applied at a point somewhat below the visible surface. Also, a finite time delay occurs before heat becomes visible at the surface.

A more realistic model is obtained by the application of DuHammil's theorem. According to DuHammil's theorem, the temperature rise in a substance can be described by the following convolution equation:

$$T = C_v \int_{-\infty}^{t} P(\tau) h'(t - \tau) d\tau \qquad (3)$$

where h is the heat dissipation function. Historically, this equation has been proven to accurately model the rise in temperature in numerous varieties of electronic components and situations. Under conditions of constant applied power, Equation (3) can be integrated:

$$T = C_v P h(t) \qquad (4)$$

Experience has shown that one can closely approximate the function h by piece-wise functions of the form:

$$h(t) = kt\alpha \qquad (5)$$

Because the above equation is linear in the log domain, $\alpha$ can be simply computed as the slope of the temperature versus time curve in the log domain:

$$\alpha = \frac{d \ln T}{d \ln t} = \frac{dT/T}{dt/t} \qquad (6)$$

The function h(t) is limited in form by physical considerations and by laws of conservation of energy and thermodynamics. Until the rise in temperature, T becomes significant. The second term in Equation (1) is very small and can be ignored. Equation (1) can be closely approximated by the simplified equation:

$$\frac{dT}{dt} = C_v P \text{ for } t < t_c \qquad (7)$$

This equation can be directly integrated to yield:

$$\frac{dT}{dt} = \frac{T}{t} = C_v P \text{ for } t < t_c \qquad (8)$$

Substitution into Equation (6) yields:

$$\alpha(t) = 1 \text{ for } t < t_c \qquad (9)$$

In the short term, the heat is applied homogeneously to a volume of material. As a consequence, heat cannot escape from the center of this volume to the surrounding material because the surrounding material has been heated also. Such processes containing negligible heat loss are defined to be adiabatic. The thermal profile was observed to be adiabatic for many components (resistors, capacitors, integrated circuit chips) for very long times, up to and including a critical time $t_c$ of up to 50 seconds. The exception appears to be zener diodes, which radiate significantly, providing a critical time of only a few seconds.

As time increases, the differential domain slope $\alpha$ will decrease to zero as the system approaches equilibrium. In practice, the form of this decrease in $\alpha$ is device dependent, but can be determined empirically from the observed thermal data. For $t > t_c$ the slope $\alpha$ was found to fit an exponential of the form:

$$\alpha(t) = (t/t_c)^\beta \text{ for } t > t_c \qquad (10)$$

In the final model, the set of thermal data has been reduced to a set of four parameters associated with each heat source on the circuit card or object:

R the heating rate (deg/sec).

$t_0$ delay time.

$t_c$ time at which thermal conduction becomes significant.

$\beta$ transient decay rate.

Of the four parameters, only heating rate R is directly related to the energy consumption of the component. The other parameters are all material and fabrication dependent. While high values of $t_c$ and low values of $\beta$ would be indicative of poor thermal design and/or fabrication, we would not expect them to vary significantly from device to device. To evaluate the above model, a reiterative extrapolation formula was developed. For $t < t_c$:

$$T = Rt \qquad (11)$$

$$t_m = \frac{t_p + t}{2} \qquad (12)$$

-continued $$\alpha = \left(\frac{t_m}{t_c}\right)^\beta \qquad (13)$$

$$T(t) = T(t_p)\left(\frac{t}{t_p}\right)^\alpha \qquad (14)$$

Once the temperature profile has been characterized, it is then a simple matter to extract the initial rise rate. These processes reduce the massive amounts of image data into a list of peak heating rates (peak temperature rate per artifact). The extraction of the parameters for the thermal model can be done using either a Genetic Algorithm across the artifact or a modified neural network. The use of either of these methods makes the processing of the heat data much faster and more reliable than by using a non-linear regression method. The genetic algorithm takes about 10 minutes to complete a hundred artifacts overlaid on 25 images. Using a modified neural network to estimate the set of coefficients representing the feature curve rise function of the artifacts across the number of images surveyed, processing time is reduced from 10 minutes to 34 seconds for the same amount of data. The heat data extracted using the neural network also proved to be equally reliable as the extracted heat data using the genetic algorithm. The subject invention can be configured to process data with either the genetic or neural data extractor with near comparable results.

In practical applications, component heating varies as a function of stimulation. When this occurs, it becomes necessary to restrict the examination to that portion of the curve with the most dramatic temperature changes. Another simple but innovative conditioning process is included which watches for a 20% decay, and when found, would initiate the search for a new heating event. This technique emphasizes the slopes, and the final delta-peak temperature recorded has vastly improved performance over the ambiguity noise especially when the artifact region had slight slopes within the data. This technique enables time-coordinated characteristics without any appreciable change in performance. Other traditional techniques, such as curve fitting, would have been cumbersome and would severely curtail the performance of the system.

Once essential features have been identified, an association can be made between these features and device performance. This association of faults is straightforward using a modified Bayesian network. The collection of faults are first divided into classes. Members of the class will have similar performance characteristics, which are assumed to be distributed according to the Gaussian or normal distribution function. A null failure class is also reserved corresponding to the performance of a good board or object. The probability density function is given by:

$$f = \prod_{i=1}^{n} \frac{1}{\sqrt{2\pi\sigma_i}} e^{\frac{-(O_i - \mu_i)^2}{2\sigma_i^2}} \qquad (15)$$

Where:

n is the number of artifacts.

$O_i$ is the observed heat rate of the i'th heat source.

$\mu_i$ is mean of the i'th heat source for members of the failure class.

$\sigma_i$ is standard deviation of the i'th heat source for members of the failure class.

For members of the failure class, the probability density function will tend to be large. For non-members, the probability density function will tend to be small. For a given observation, the evaluation of Equation 15 is referred to as the likelihood of the failure class. Likelihoods can be used to estimate the probability of belonging to the particular class, in particular:

$$P_c = n_c f_c / \sum_{j=1}^{k} n_j f_j \quad (16)$$

Where:
$P_c$ is the probability of occurrence of the c'th failure class.
k is the number of failure classes.
$f_c$ is the likelihood of the c'th failure class.
$n_c$ is the number of historical samples associated with the c'th failure class.

The neural network identifies the most likely failure class as the one with the highest probability of occurrence.

In practice, the mean and standard deviations of the failure classes are not known. They can only be estimated. On the other hand, the predictor from such an estimated computation can be more accurate than fault identification obtained from more traditional techniques. The implemented likelihood computations are made in terms of $m_i$ and $z_i$, which are estimates of the population mean and standard deviations. Equation (17) becomes:

$$f = \prod_{i=1}^{n} e^{\frac{-(o_i - m_i)^2}{2z_i^2}}$$

The mean value can be estimated from as little as a single sample. The traditional estimate of mean is given by:

$$m = \sum_{i=1}^{n_c} \frac{o_i}{n_c}$$

Where f is the number of examples of the failure class. The distribution of statistic $$F = \sum_{i=1}^{n} \frac{-(o_i - m_i)^2}{2z_i^2}$$

can be approximated by an F distribution with n,nc degrees of freedom, and a confidence estimate can be made if the element belongs to a particular class. This statistic can be used to reject an object from being "good", even if the associated failure mode has never been observed. For this reason, the system can begin making correct diagnosis upon being trained with as few as one "good" object.

The final portion of the subject invention is the diagnosis and repair process. Upon taking thermal samples of one or more "good" reference objects, the operator then analyzes a test object. By applying the same heating process to the test object, the thermal data is collected by a digital computer. The operator then directs the neural network to analyze the data. The neural network diagnoses the test object, first providing a confidence value that the given test object compares favorably with the "good" reference object or objects. If this confidence value is low, then the object is very probably defective. As information accumulates, the subject invention will classify the object with other failures and/or heating profiles in the historical data which match the test object. After this is accomplished, the invention provides a unique graphical display of the thermal image in which the artifacts of the out-of-profile areas are labeled with flags. The artifacts that are most out of tolerance are assigned the brightest colors. This provides the operator with useful information concerning which objects or components should be repaired or replaced.

This invention is different from other thermal diagnostic systems because it has the ability to learn from its mistakes. When testing a circuit board for example, fan out can occur, which is a process that defines how failures in one component can affect many other components. A fault along the input paths to any component can cause that device to malfunction. Fan out can cause most of the board to be out of profile when only one real fault exists. Identifying the actual faulty component requires a technician's skill, experience, and sometime trial and error. A technician's experience would include information on component susceptibility, such as the common failure of integrated circuit (IC) chips and relays as opposed to more reliable capacitors and resistors. Most automatic test equipment (ATE) repair processes, especially for electronics, isolate faults to an ambiguity group, which is a list of possible component replacements. Conventional ATE will repeatedly give an ambiguous list of components until it is reprogrammed. The technician is forced to rely upon experience and guesswork. The subject invention allows the technician to correct a false ATE directive in minutes. The same errors need not be repeated.

The subject invention is effective for analyzing running jet engines, crack detection in many materials, heat effects assessment of hydraulic, radiator, or air conditioning systems, medical diagnosis, and electronic circuit card diagnosis. The key element required is the presence of heat dynamics (changing heat) in the reference and test subjects. The invention is best practiced when the computer of FIG. 1 is programmed with the source code of the attached appendix.

Clearly many modifications and variations of the present invention are possible in light of the above teachings and it is therefore understood that, within the inventive scope of the inventive concept, that the invention may be practiced otherwise than specifically claimed.

What is claimed is:

1. A process for analyzing an object to determine its functional status, comprising:
  scanning a reference object with an infrared detector to measure infrared radiation emitted from the reference object and determining its heating rate thereby;
  scanning a test object with an infrared detector to measure infrared radiation emitted from the test object and determining its heating rate thereby;
  comparing the reference and test object heating rates to determine if the test object is functioning within specified tolerances;
  graphically displaying a thermal image generated from the infrared detector; and
  identifying the test object if it exceeds specified tolerances.

2. The process defined by claim 1, wherein only infrared radiation within defined regions on the reference object is analyzed.

3. The process defined by claim 2, further comprising a step of reducing infrared data to a peak temperature value for each defined region of the reference object by comparing two adjacent pixel temperature values within a region, only accepting a pixel temperature value as accurate if it has an equally high temperature as an adjacent pixel, and using accepted pixel temperature values to determine the peak temperature within each defined region.

4. The process defined by claim 1, wherein only infrared radiation within defined regions on the test object is analyzed.

5. The process defined by claim 4, further comprising a step of reducing the infrared data to a peak temperature value for each defined region of the test object by comparing two adjacent pixel temperature values within a region, only accepting a pixel temperature value as accurate if it has an equally high temperature as an adjacent pixel, and using accepted pixel temperature values to determine the peak temperature within each defined region.

6. The process defined by claim 1, wherein a graphic display is used to visually compare two objects simultaneously.

7. The process defined by claim 1, wherein any part of a reference object is visually assessed by zooming into that part of the graphic image.

8. The process defined by claim 1, wherein any part of a test object is visually assessed by zooming into that part of the graphic image.

9. The process defined by claim 1, wherein comparison of reference and test object heating rates is accomplished by generating a confidence estimate that a test object is within specified tolerances by dividing test objects into classes and analyzing the likelihood that a test object in a particular class will fail based on data measured from prior scanning of reference and test objects.

10. A system for analyzing an object to determine its functional status, comprising:

means for scanning a reference object with an infrared detector to measure infrared radiation emitted from the reference object and determining its heating rate thereby;

means for scanning a test object with an infrared detector to measure infrared radiation emitted from the test object and determining its heating rate thereby;

means for comparing the reference and test object heating rates to determine if the test object is functioning within specified tolerances;

means for graphically displaying a thermal image generated from the infrared detector; and means for identifying the test object if it exceeds specified tolerances.

11. The system defined by claim 10, wherein only infrared radiation within defined regions on the reference object is analyzed.

12. The system defined by claim 11, further comprising a means for reducing infrared data to a peak temperature value for each defined region of the reference object by comparing two adjacent pixel temperature values within a region, only accepting a pixel temperature value as accurate if it has an equally high temperature as an adjacent pixel, and using accepted pixel temperature values to determine the peak temperature within each defined region.

13. The system defined by claim 10, wherein only infrared radiation within defined regions on the test object is analyzed.

14. The system defined by claim 13, further comprising a means for reducing the infrared data to a peak temperature value for each defined region of the test object by comparing two adjacent pixel temperature values within a region, only accepting a pixel temperature value as accurate if it has an equally high temperature as an adjacent pixel, and using accepted pixel temperature values to determine the peak temperature within each defined region.

15. The system defined by claim 10, wherein a graphic display is used to visually compare two objects simultaneously.

16. The system defined by claim 10, wherein any part of a reference object is visually assessed by zooming into that part of the graphic image.

17. The system defined by claim 10, wherein any part of a test object is visually assessed by zooming into that part of the graphic image.

18. The system defined by claim 10, wherein comparison of reference and test object heating rates is accomplished by generating a confidence estimate that a test object is within specified tolerances by dividing test objects into classes and analyzing the likelihood that a test object in a particular class will fail based on data measured from prior scanning of reference and test objects.

* * * * *